United States Patent
Mallik et al.

(10) Patent No.: US 12,183,650 B2
(45) Date of Patent: Dec. 31, 2024

(54) HEAT EXTRACTION PATH FROM A LASER DIE USING A HIGHLY CONDUCTIVE THERMAL INTERFACE MATERIAL IN AN OPTICAL TRANSCEIVER

(71) Applicant: Intel Corporation, Santa Clara, CA (US)

(72) Inventors: Aditi Mallik, Cupertino, CA (US); Chen Zhuang, Santa Clara, CA (US); Raghuram Narayan, Newark, CA (US)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 17/131,642

(22) Filed: Dec. 22, 2020

(65) Prior Publication Data
US 2022/0199486 A1 Jun. 23, 2022

(51) Int. Cl.
*H01L 23/10* (2006.01)
*H01L 23/367* (2006.01)
*H01L 23/373* (2006.01)

(52) U.S. Cl.
CPC ...... *H01L 23/3675* (2013.01); *H01L 23/3735* (2013.01)

(58) Field of Classification Search
CPC .......................... H01L 23/3675; H01L 23/3735
USPC .................................................. 257/706, 713
See application file for complete search history.

(56) References Cited

U.S. PATENT DOCUMENTS

| | | | | |
|---|---|---|---|---|
| 5,396,403 | A * | 3/1995 | Patel | H01L 23/433 257/713 |
| 5,931,222 | A * | 8/1999 | Toy | H01L 23/42 361/708 |
| 6,252,774 | B1 * | 6/2001 | Rife | H01L 23/433 257/E23.09 |
| 9,089,052 | B2 * | 7/2015 | Li | H01L 25/0655 |
| 9,570,883 | B2 | 2/2017 | Zarbock et al. | |
| 9,646,910 | B2 | 5/2017 | Ahuja et al. | |
| 9,892,990 | B1 | 2/2018 | Galloway | |
| 11,830,787 | B2 * | 11/2023 | Eid | H01L 23/5386 |
| 2005/0180113 | A1 * | 8/2005 | Shirakami | F28D 15/0233 257/E23.09 |
| 2012/0241941 | A1 * | 9/2012 | Kim | H01L 23/367 438/122 |
| 2013/0270691 | A1 | 10/2013 | Mallik | |
| 2013/0308898 | A1 * | 11/2013 | Doerr | G02B 6/12 385/14 |

(Continued)

OTHER PUBLICATIONS

Search Report from European Patent Application No. 21208879.3, mailed Jun. 8, 2022, 7 pgs.

*Primary Examiner* — Nitin Parekh
(74) *Attorney, Agent, or Firm* — Schwabe, Williamson & Wyatt, P.C.

(57) ABSTRACT

A semiconductor package comprises a substrate and a ceramic carrier mounted to the substrate. An integrated circuit (IC) die is mounted to the ceramic carrier. A heat extraction path away from the IC die comprises: i) a thermal interface material over the IC die, the thermal interface material having a thickness of approximately 25 to 80 um; ii) an integrated heat spreader over the thermal interface material; iii) a ceramic carrier plate over the integrated heat spreader; and iv) an electrically conductive thermal pad between the ceramic carrier plate and a housing of the semiconductor package.

23 Claims, 6 Drawing Sheets

(56) References Cited

U.S. PATENT DOCUMENTS

| | | | |
|---|---|---|---|
| 2015/0262904 A1* | 9/2015 | Hung | H01L 25/0657 257/713 |
| 2019/0004573 A1* | 1/2019 | Kulkarni | H01L 23/473 |
| 2021/0043573 A1* | 2/2021 | Eid | H01L 25/18 |

* cited by examiner

HEAT EXTRACTION PATH FROM A LASER DIE USING A HIGHLY CONDUCTIVE THERMAL INTERFACE MATERIAL IN AN OPTICAL TRANSCEIVER

TECHNICAL FIELD

Embodiments of the disclosure are in the field of semiconductor packages and, in particular, the methods and systems for a heat extraction path from an integrated circuit (IC) die, such as a laser die, using a highly conductive thermal interface material.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used to protect an integrated circuit (IC) chip or die, and provide the die with an electrical interface to external circuitry. With the increasing demand for smaller electronic devices, semiconductor packages are designed to be even more compact and must support larger circuit density, which in some cases may create heat conduction issues.

For example, a semiconductor package containing at least one die on a ceramic carrier, which is mounted to a printed circuit board (PCB). Wire bonds couple the die to the PCB, and a housing covers the die. To provide an efficient conduction path from the die, thermal gel or thermal pads are placed on the die to draw heat out. This solution, however, is not very efficient due to a relatively thick bondline(~5.00 to 700 um) of the thermal pad. Thermal pad compression can also put stress on the die that can deteriorate the performance. The differing coefficients of thermal expansion (CTEs) of the PCB, the die, the thermal pads and the housing can create stress in the package caused by CTE mismatches within the package.

DESCRIPTION OF THE EMBODIMENTS

Figure 1:
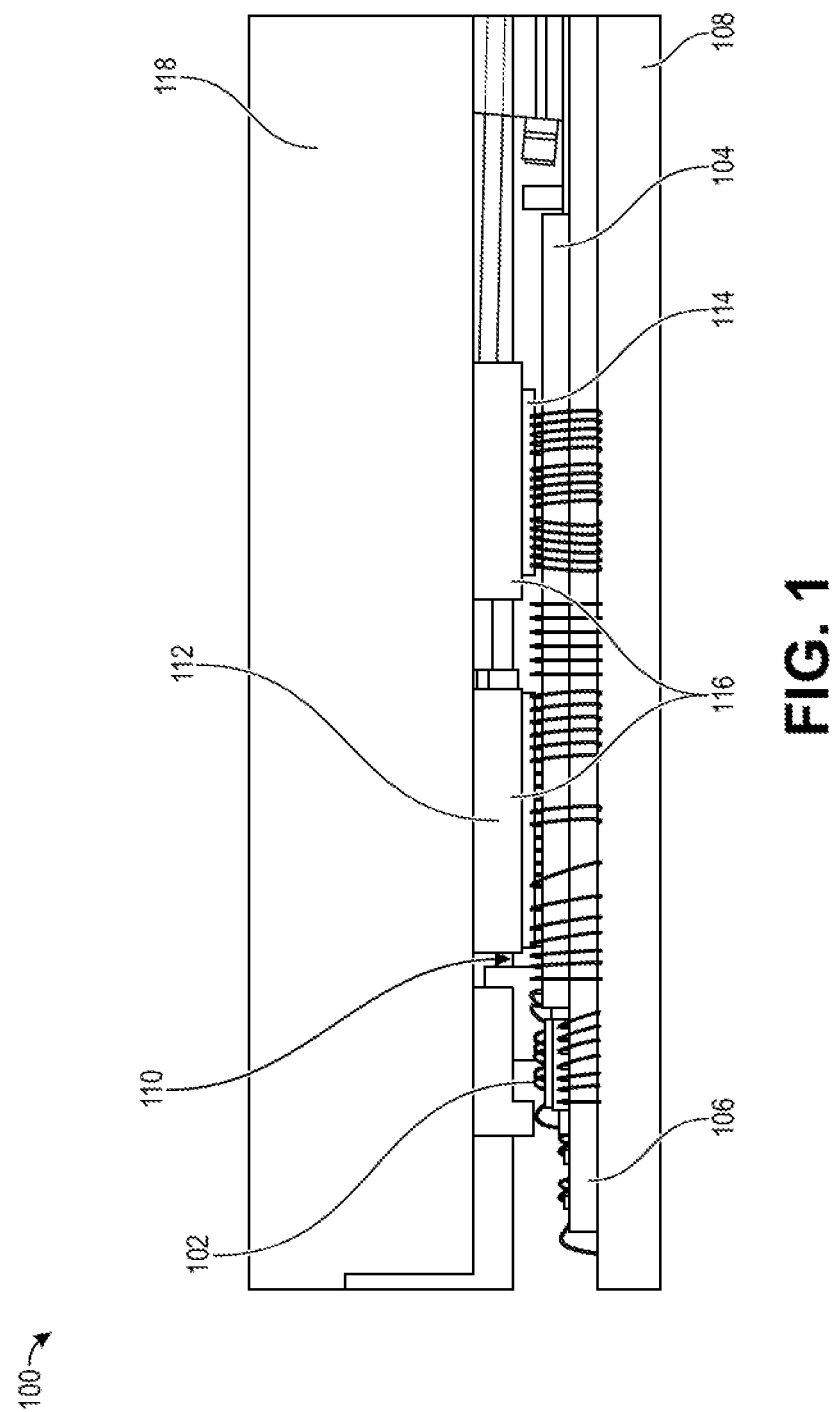
FIG. 1 illustrates a cross-section view of an example semiconductor package and heat conduction path therein.

Methods and systems for extracting heat from an integrated circuit (IC) die, such as a laser die, using a highly conductive thermal interface material are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to methods and structures for extracting heat from an integrated circuit (IC) die, such as a laser die, using a highly conductive thermal interface material in a semiconductor package.

In accordance with one or more embodiments described herein, methods and structures for extracting heat from an IC die, such as a laser die, using a highly conductive thermal interface material in a semiconductor package is disclosed. The semiconductor package comprises a substrate, a ceramic area over the substrate, and an IC die over the ceramic carrier. A heat extraction path away from the IC die comprises: i) a thermal interface material over the IC die, the thermal interface material having a thickness of approximately 25 to 80 um; ii) an integrated heat spreader over the thermal interface material; iii) a ceramic carrier plate over the integrated heat spreader; and iv) an electrically conductive thermal pad between the ceramic carrier plate and a housing of the semiconductor package. In embodiments, the IC die may comprise a laser or photonics die and the semiconductor package may comprise an optical transceiver.

According to the disclosed embodiments, the semiconductor package provides an efficient the extraction or conduction path from the IC/laser die to minimize both the temperature of the IC/laser die and a temperature delta between the housing of the package and components therein. Furthermore, no direct contact on top of the IC/laser die is required for heat sink purposes.

To provide context, FIG. 1 illustrates a cross-section view of an example semiconductor package and heat conduction path therein. The semiconductor package, such as an optical transceiver package 100, contains a laser driver die 102 adjacent to a laser die 104. A laser die 104 has one or more integrated photon emitters such as a laser, and the laser driver die 102 includes integrated circuits including driver circuits for the modulating the beam emitted by the laser. The laser driver die 102 and the laser die 104 are mounted to a ceramic carrier 106, which in turn, is mounted or bonded to a substrate 108. Wire bonds 110 couple the laser driver die 102 and the laser die 104 to the substrate 108. An integrated passive device (IPD) 112 and a heat sync die (HSD) 114 are shown over the laser die 104. A housing 118 covers the various components and completes the semiconductor package. A heat conduction path away from the laser driver die 102 and the laser die 104 is needed without directly contacting a top of the laser driver die 102 and the laser die 104 for heat sinking purposes.

To provide a conduction path away from the laser die 104, one or more thermal gap pads 116 are placed on the IPD 112 and the HSD 114 to draw heat out. The thermal gap pad is one of main bottlenecks in the thermal path. Thermal gap pads with high thermal conductivity are also electrically conductive. However, if a requirement of the semiconductor package is to electrically isolate the housing ground from the substrate ground, then use of a thermal gap pad with high thermal conductivity is precluded. Instead, the thermal gap pads 116 placed over the laser die 104 are non-electrically conductive, and are therefore relatively thick at approximately 500-700 um in height.

The solution of placing the thermal gap pad 116 on the laser die 104 to draw heat away is not very efficient due to a relatively thick bondline of the thermal pads. Thermal gap pad compression can also put stress on the laser die 104 that can deteriorate the performance of the laser. The differing coefficients of thermal expansion (CTEs) of the substrate 108, the laser driver die 102, the laser die 104, the thermal gap pads 116 and the housing 118 can create stress in the semiconductor package caused by CTE mismatches within the package. In addition, placement of the thermal gap pads 116 on the laser die 104 causes the temperature of a backside (top) of the laser die 104 to be higher than 95° Celsius, which violates thermal specifications and also creates more than a 10° Celsius temperature difference with the housing 118.

Accordingly, there is increased need to provide an efficient heat conduction or extraction path from an IC die in a semiconductor package to maintain a low temperature delta between the housing and the die therein. The disclosed embodiments will be described in terms of an optical transceiver semiconductor package comprising a laser die and accompanying laser driver die, but it is to be understood that the disclosed embodiments are applicable to semiconductor packages containing at least one integrated circuit (IC) die.

Figure 2:
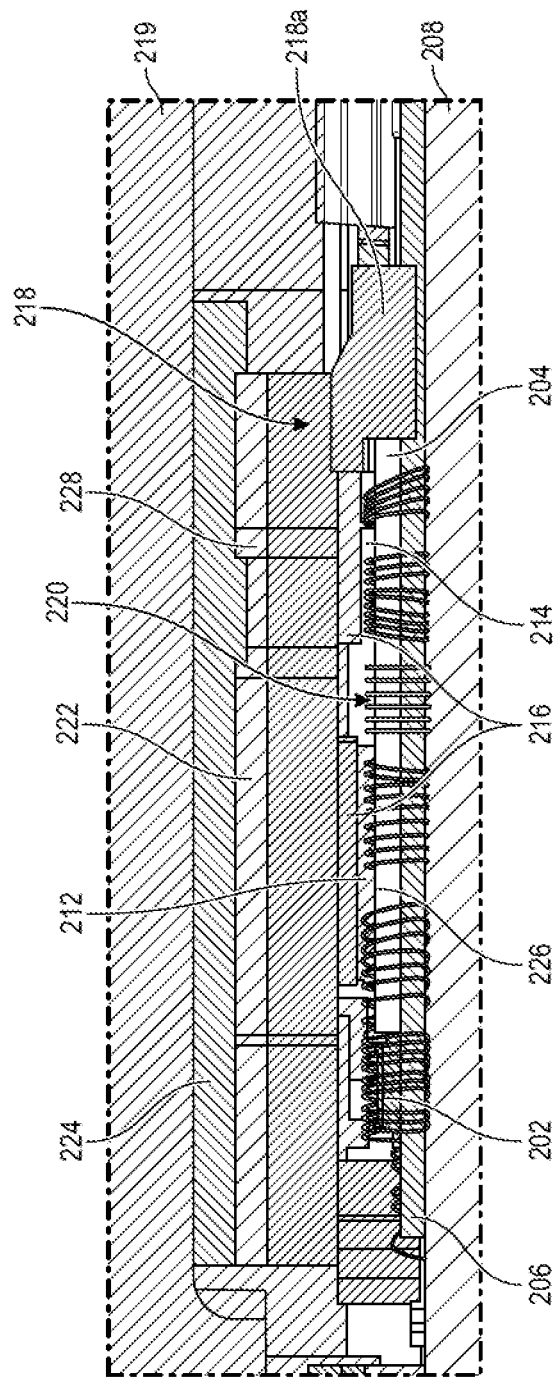
FIG. 2 illustrates a cross-section view of an optical transceiver semiconductor package and heat extraction path therein.

FIG. 2 illustrates a cross-section view of an optical transceiver semiconductor package and heat extraction path therein. In an optical transceiver, high power consumption comes from a laser driver die 202 and a laser die 204, which are both part of a transmission optical sub-assembly (TOSA). The TOSA requires effective heat transfer to maintain a low temperature delta between a transceiver housing 219 and components. The top surface of the laser driver die 202 cannot be directly contacted for heat sinking purpose and a laser region on the laser die 204 cannot be exposed to high pressure. Any thermal expansion in high temperature operating condition could shift the light emitting path and sabotage light coupling efficiency.

Similar to the package shown in FIG. 1, the optical transceiver semiconductor package 200 comprises a printed circuit board assembly (PCBA) 208 and a ceramic carrier 206 mounted to the PCBA 208. In one embodiment, a silicon interposer can be substituted for the ceramic carrier 206 for cost reduction. At least IC die, such as laser die 204, is mounted on the ceramic carrier 206. In one embodiment, the laser driver die 202 and/or the laser die 204 may be attached to the ceramic carrier 206 using any suitable epoxy. In the embodiment shown, a laser driver die 202 is also mounted to the ceramic carrier 206 adjacent to a laser die 204. Wire bonds 220 couple the laser driver die 202 and the laser die 204 to the PCBA 208. A housing 219 of the optical transceiver semiconductor package 200 covers the various components.

According to the disclosed embodiments, the optical transceiver semiconductor package 200 further includes a heat extraction path away from the laser die 204 and the laser driver die 202. The heat extraction path comprises the following.: i) at least one of an integrated passive device (IPD) 212 or a heat sink die (HSD) 214, ii) a thermal interface material (TIM) 216, iii) a copper integrated heat spreader (IHS) 218, iv) a ceramic carrier plate 222, iv) and an electrically conductive thermal gap pad 224.

In further detail, the integrated passive device (IPD) 212 and the heat sink die (HSD) 214 are on a top surface of the laser die 204, and may be mounted via copper pillars 226 for example. In embodiments, the IPD 212 is on a first portion of the laser die 204, and the HSD 214 is on a second portion of the laser die 204. As used herein, an IPD "or Integrated Passive Component (IPC) or Embedded Passive Component" are electronic components such as resistors (R), capacitors (C), inductors(L)/coils/chokes, microstriplines, impedance matching elements, baluns or any combinations thereof that are integrated in the same package or on the same substrate. The HSD 214 may comprise heat sink is a passive heat exchanger that transfers heat generated by the laser die 204.

The thermal interface material (TIM) 216 is over both the IPD 212 and the HSD 214. In one embodiment, a gap may exist between a first portion of the TIM 216 over the IPD 212 and a second portion of the TIM 216 over the HSD 214. Compared to FIG. 1, the TIM 216 is relatively thin at approximately 25 to 80 um in thickness. As used herein, a thermal interface material is a product that improves thermal conduction better than air between mated surfaces. The thermal interface material may comprise a gel-like substance or a solid-like pad.

The copper IHS 218 is over the thermal interface material 216. Although copper may be used to form the IHS, the IHS may comprise any suitable material that facilitates drawing heat from the laser die 204 and the laser driver die 202. In one embodiment, the copper IHS 218 may extend substantially over both the laser driver die 202 and the laser die 204. The copper IHS 218 may include at least one portion 218a that is connected to PCBA ground. In one embodiment, the copper IHS 218 may be approximately 1.6 millimeters in thickness.

The ceramic carrier plate 222 is over the copper IHS 218. In one embodiment, the ceramic carrier plate 222 comprises aluminum nitride (AlN). The ceramic carrier plate 222 is bonded to the copper IHS 218 via bonding layer 228. In one embodiment, the ceramic carrier plate 222 may be approximately 0.38 mm in thickness.

The electrically conductive thermal gap pad 224 is between the ceramic carrier plate 222 and the housing 219 of the optical transceiver semiconductor package 200. In one embodiment, the electrically conductive thermal gap pad 224 may be approximately 0.6 millimeters in thickness.

Use of the ceramic carrier plate 222 and the copper IHS 218 act as bench to hold the laser die 204 and laser driver die 202. This bench acts as a heat spreader from the laser driver die 202 to the laser die 204. The heat from lasers on the laser die 204 is then spread to the copper IHS 218 via the copper pillars 226, the IPD 212 and HSD 214, and the thermal interface material 216. To electrically isolate, and yet have an efficient thermal path to the housing 219, the ceramic carrier plate 222 may be soldered or brazed to the copper IHS 218 and the highly electrically conductive thermal gap pad 224 is used in between the ceramic carrier plate 222 and the housing 219 of the optical transceiver semiconductor package 200. The ceramic carrier plate 222 acts as insulating layer between the housing 219 and PCBA 208. Since ceramic is CTE (coefficient of thermal expansion) matched to the silicon of the laser die 204, the stress from the additional ceramic carrier plate 222 should be minimum.

Figure 3A:
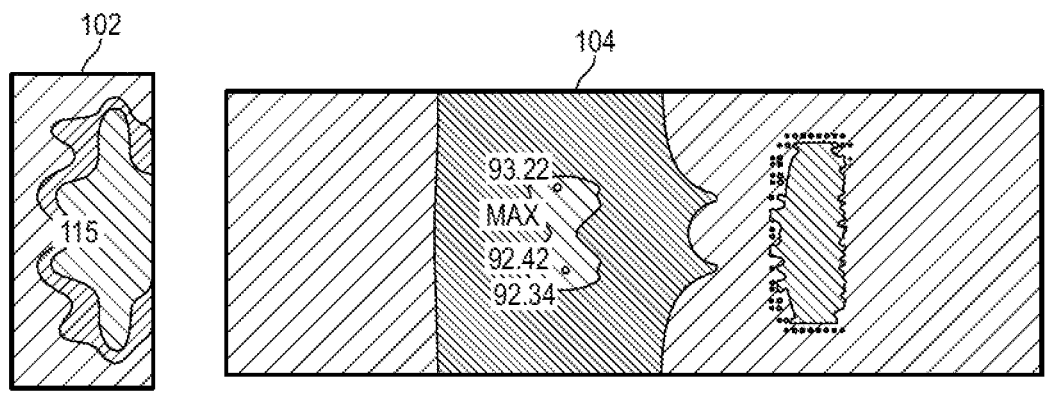
FIGS. 3A and 3B respectively illustrate thermal simulations comparing backside temperatures of the laser driver die and laser die from FIG. 1 and the laser driver die and laser die from FIG. 2.
Figure 3B:
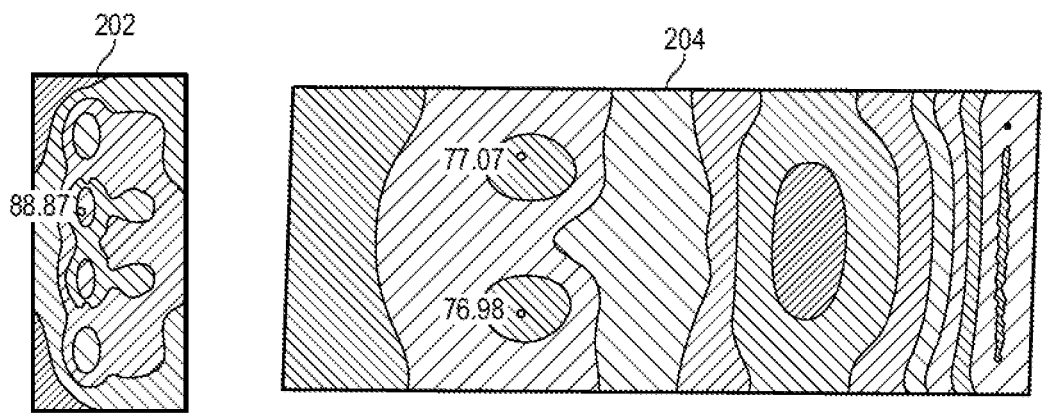

FIGS. 3A and 3B respectively illustrate thermal simulations comparing backside temperatures of the laser driver die 102 and laser die 104 from FIG. 1 and the laser driver die 202 and laser die 204 from FIG. 2. FIG. 3A shows that the top of the laser die 104 heats up to 93° C. and the top of the laser driver die 102 heat up to 115° C. in the embodiment of FIG. 1, resulting in housing temperature of 70° C. Thus, the delta between the laser die 104 and the housing temperature is much greater than 10° C., violating thermal criteria.

FIG. 3B shows that the backside of the laser die 204 heats up to only approximately 77° C. and the top of the laser driver die 202 heats up to approximately 89° C., providing a sufficient thermal margin. Thus, the heat conduction path of FIG. 2 maintains an operating temperature on a top of the laser die 204 that is within a 6-7° C. temperature delta with an operating temperature of the housing 219.

Figure 4:
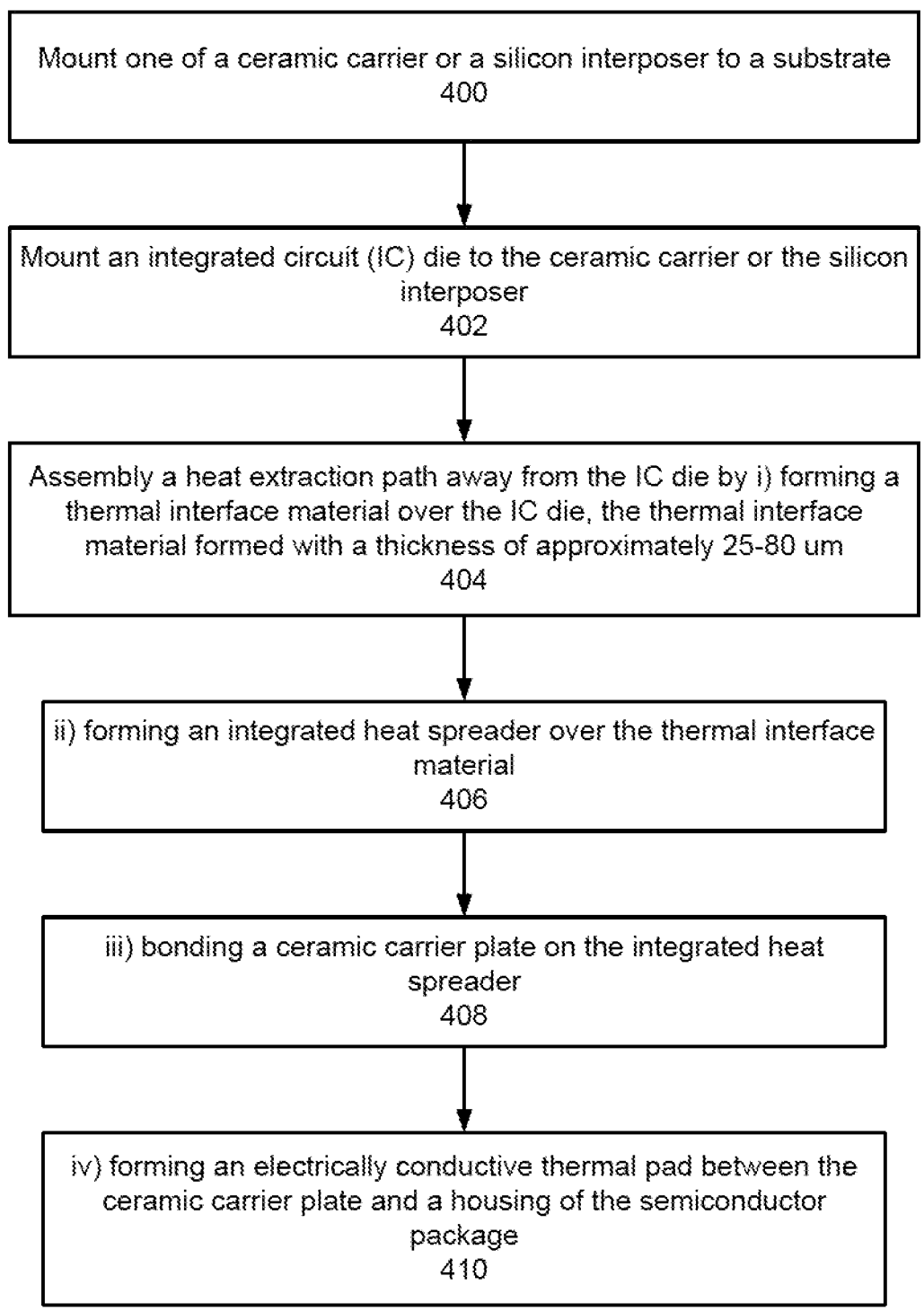
FIG. 4 illustrates a process for fabricating a semiconductor package.

FIG. 4 illustrates a process for fabricating a semiconductor package. The process may begin by mounting one of a ceramic carrier or a silicon interposer to a substrate (block 400). An integrated circuit (IC) die is mounted to the ceramic carrier or the silicon interposer (block 402). A heat extraction path away from the IC die is assembled by the following, including forming a thermal interface material over the IC die, the thermal interface material formed with a thickness of approximately 25 to 80 um (block 404). An integrated heat spreader is formed over the thermal interface material (block 406). A ceramic carrier plate is bonded on the integrated heat spreader (block 408). An electrically conductive thermal pad is formed between the ceramic carrier plate and a housing of the semiconductor package (block 410).

Figure 5:
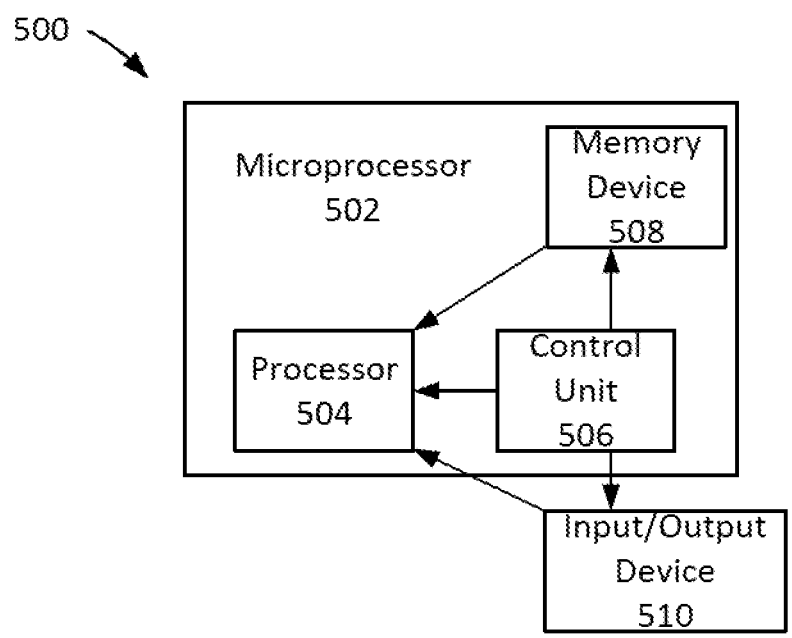
FIG. 5 illustrates a block diagram of an electronic system, in accordance with an embodiment of the present disclosure.

FIG. 5 illustrates a block diagram of an electronic system 500, in accordance with an embodiment of the present disclosure. The electronic system 500 can correspond to, for example, a portable system, a computer system, a process control system, or any other system that utilizes a processor and an associated memory. The electronic system 500 may include a microprocessor 502 (having a processor 504 and control unit 506), a memory device 508, and an input/output device 510 (it is to be appreciated that the electronic system 500 may have a plurality of processors, control units, memory device units and/or input/output devices in various embodiments). In one embodiment, the electronic system 500 has a set of instructions that define operations which are to be performed on data by the processor 504, as well as, other transactions between the processor 504, the memory device 508, and the input/output device 510. The control unit 506 coordinates the operations of the processor 504, the memory device 508 and the input/output device 510 by cycling through a set of operations that cause instructions to be retrieved from the memory device 508 and executed. The memory device 508 can include a non-volatile memory cell as described in the present description. In an embodiment, the memory device 508 is embedded in the microprocessor 502, as depicted in FIG. 5. In an embodiment, the processor 504, or another component of electronic system 500, includes one or more heat extraction paths from a die using a highly conductive thermal interface material, such as those described herein.

Figure 6:
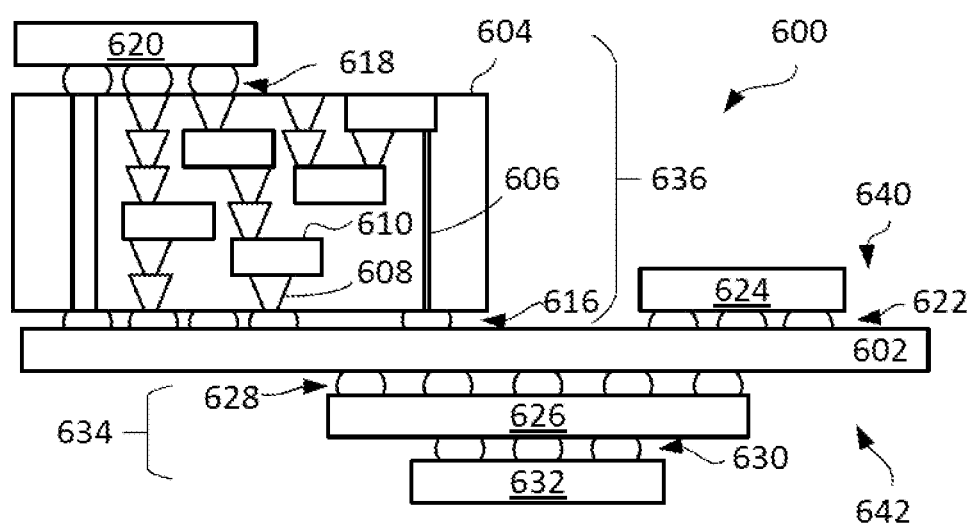
FIG. 6 is a cross-sectional side view of an integrated circuit (IC) device assembly that may include one or more heat extraction paths from a die using a highly conductive thermal interface material, in accordance with one or more of the embodiments disclosed herein.

FIG. 6 is a cross-sectional side view of an integrated circuit (IC) device assembly that may include one or more heat extraction paths from a die using a highly conductive thermal interface material, in accordance with one or more of the embodiments disclosed herein.

Referring to FIG. 6, an IC device assembly 600 includes components having one or more integrated circuit structures described herein. The IC device assembly 600 includes a number of components disposed on a circuit board 602 (which may be, e.g., a motherboard). The IC device assembly 600 includes components disposed on a first face 640 of the circuit board 602 and an opposing second face 642 of the circuit board 602. Generally, components may be disposed on one or both faces 640 and 642. In particular, any suitable ones of the components of the IC device assembly 600 may include a number of a heat extraction path from a die using a highly conductive thermal interface material, such as disclosed herein.

In some embodiments, the circuit board 602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 602. In other embodiments, the circuit board 602 may be a non-PCB substrate.

The IC device assembly 600 illustrated in FIG. 6 includes a package-on-interposer structure 636 coupled to the first face 640 of the circuit board 602 by coupling components 616. The coupling components 616 may electrically and mechanically couple the package-on-interposer structure 636 to the circuit board 602, and may include solder balls (as shown in FIG. 6), male and female portions of a socket, an adhesive, an underfill material, and/or any other suitable electrical and/or mechanical coupling structure.

The package-on-interposer structure 636 may include an IC package 620 coupled to an interposer 604 by coupling components 618. The coupling components 618 may take any suitable form for the application, such as the forms discussed above with reference to the coupling components 681. Although a single IC package 620 is shown in FIG. 6, multiple IC packages may be coupled to the interposer 604. It is to be appreciated that additional interposers may be coupled to the interposer 604. The interposer 604 may provide an intervening substrate used to bridge the circuit board 602 and the IC package 620. The IC package 620 may be or include, for example, a die (e.g., die 104 or 204), or any other suitable component. Generally, the interposer 604 may spread a connection to a wider pitch or reroute a connection to a different connection. For example, the interposer 604 may couple the IC package 620 (e.g., a die) to a ball grid array (BGA) of the coupling components 816 for coupling to the circuit board 602. In the embodiment illustrated in FIG. 6, the IC package 620 and the circuit board 602 are attached to opposing sides of the interposer 604. In other embodiments, the IC package 620 and the circuit board 602 may be attached to a same side of the interposer 604. In some embodiments, three or more components may be interconnected by way of the interposer 604.

The interposer 604 may be formed of an epoxy resin, a fiberglass-reinforced epoxy resin, a ceramic material, or a polymer material such as polyimide. In some implementations, the interposer 604 may be formed of alternate rigid or flexible materials that may include the same materials described above for use in a semiconductor substrate, such as silicon, germanium, and other group III-V and group IV materials. The interposer 604 may include metal interconnects 810 and vias 608, including but not limited to through-silicon vias (TSVs) 606. The interposer 604 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 604. The package-on-interposer structure 636 may take the form of any of the package-on-interposer structures known in the art.

The IC device assembly 600 may include an IC package 624 coupled to the first face 640 of the circuit board 602 by coupling components 622. The coupling components 622 may take the form of any of the embodiments discussed above with reference to the coupling components 622, and the IC package 624 may take the form of any of the embodiments discussed above with reference to the IC package 620.

The IC device assembly 600 illustrated in FIG. 6 includes a package-on-package structure 634 coupled to the second face 642 of the circuit board 602 by coupling components 628. The package-on-package structure 634 may include an IC package 626 and an IC package 632 coupled together by coupling components 630 such that the IC package 626 is disposed between the circuit board 602 and the IC package 632. The coupling components 628 and 630 may take the form of any of the embodiments of the coupling components 816 discussed above, and the IC packages 626 and 632 may take the form of any of the embodiments of the IC package 620 discussed above. The package-on-package structure 634 may be configured in accordance with any of the package-on-package structures known in the art.

Figure 7:
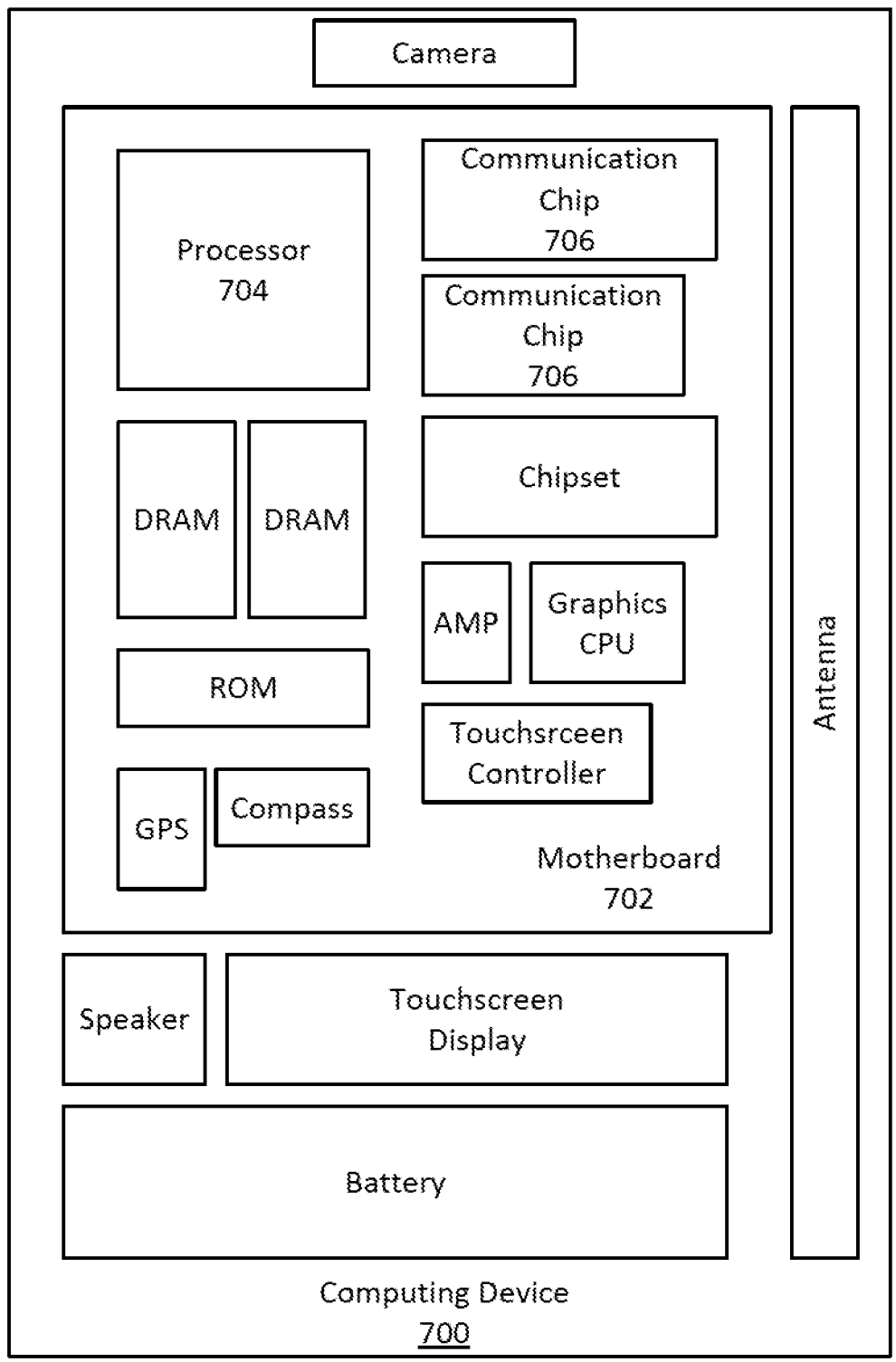
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes one or more heat extraction paths from a die using a highly conductive thermal interface material, in accordance with implementations of embodiments of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the disclosure, the integrated circuit die of the communication chip includes one or more heat extraction paths from a die using a highly conductive thermal interface material, in accordance with implementations of embodiments of the disclosure.

In further implementations, another component housed within the computing device 700 may contain an integrated circuit die that includes one or more heat extraction paths from a die using a highly conductive thermal interface material, in accordance with implementations of embodiments of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments described herein include a heat extraction path from a die using a highly conductive thermal interface material.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A semiconductor package comprises a substrate and a ceramic carrier mounted to the substrate. An integrated circuit (IC) die is mounted to the ceramic carrier. A heat extraction path away from the IC die comprises: i) a thermal interface material over the IC die, the thermal interface material having a thickness of approximately 25 to 80 um; ii) an integrated heat spreader over the thermal interface material; iii) a ceramic carrier plate over the integrated heat spreader; and iv) an electrically conductive thermal pad between the ceramic carrier plate and a housing of the semiconductor package.

Example embodiment 2: The semiconductor package of embodiment 1, wherein the heat extraction path further comprise at least one of an integrated passive device (IPD) or a heat sink die (HSD).

Example embodiment 3: The semiconductor package of embodiment 2, wherein the at least one of the IPD or the HSD is mounted to a top surface of the IC die via copper pillars.

Example embodiment 4: The semiconductor package of embodiment 3, wherein the IPD is on a first portion of the IC die, and the HSD is over a second portion of the IC die.

Example embodiment 5: The semiconductor package of embodiment 2, 3 or 4, wherein the thermal interface material over the at least one of the IPD or the HSD.

Example embodiment 6: The semiconductor package of embodiment 2, 3, 4 or 5, wherein the thermal interface material (TIM) is over both the IPD or the HSD and a gap exist between a first portion of the TIM over the IPD and a second portion of the TIM over the HSD.

Example embodiment 7: The semiconductor package of embodiment 1, 2, 3, 4, 5 or 6 wherein the integrated heat spreader comprises copper.

Example embodiment 8: The semiconductor package of embodiment 1, 2, 3, 4, 5, 6, or 7, wherein the integrated heat spreader is approximately 1.6 millimeters in thickness.

Example embodiment 9: The semiconductor package of embodiment 1, 2, 3, 4, 5, 6, 7, or 8, wherein the ceramic carrier plate comprises aluminum nitride (AlN).

Example embodiment 10: The semiconductor package of embodiment 1, 2, 3, 4, 5, 6, 7, 8 or 9, wherein the ceramic carrier plate is approximately 0.38 mm in thickness.

Example embodiment 11: The semiconductor package of embodiment 1, 2, 3, 4, 5, 6, 7, 8, 9, or 10, wherein the electrically conductive thermal gap pad is approximately 0.6 millimeters in thickness.

Example embodiment 12: The semiconductor package of embodiment 1, 2, 3, 4, 5, 6, 7, 8, 9, 10, or 11, wherein the heat extraction path maintains an operating temperature on a top of the IC die that is within a 6-7° C. temperature delta with an operating temperature of the housing.

Example embodiment 13: An optical transceiver package comprises a printed circuit board assembly (PCBA) and a ceramic carrier or a silicon interposer mounted to the PCBA. A laser die is mounted to the ceramic carrier or the silicon interposer. A heat extraction path away from the laser die comprises: an integrated passive device (IPD) on a first portion of the laser die, a heat sink die (HSD) over a second portion of the laser die, a thermal interface material over both the IPD and the HSD, a copper integrated heat spreader over the thermal interface material; a ceramic carrier plate over the copper integrated heat spreader, and an electrically conductive thermal gap pad between the ceramic carrier plate and a housing of the optical semiconductor package.

Example embodiment 14: The optical transceiver package of embodiment 13, wherein the thermal interface material is approximately 25 to 80 um in thickness.

Example embodiment 15: The optical transceiver package of embodiment 13 or 14, wherein the thermal interface material (TIM) is over both the IPD or the HSD, and a gap exist between a first portion of the TIM over the IPD and a second portion of the TIM over the HSD.

Example embodiment 16: The optical transceiver package of embodiment 13, 14 or 15, further comprising a laser driver die mounted adjacent to the laser die on the PCBA.

Example embodiment 17: The optical transceiver package of embodiment 13, 14, 15 or 16, wherein the copper integrated heat spreader (IHS) extends over both the laser driver die and the laser die.

Example embodiment 18: The optical transceiver package of embodiment 13, 14, 15, 16 or 17, wherein the copper IHS includes at least one portion connected to PCBA ground.

Example embodiment 19: The optical transceiver package of embodiment 13, 14, 15, 16, 17 or 18, wherein the copper IHS is approximately 1.6 millimeters in thickness.

Example embodiment 20: The optical transceiver package of embodiment 13, 14, 15, 16, 17, 18, or 19, wherein the ceramic carrier plate comprises aluminum nitride (AlN).

Example embodiment 21: The optical transceiver package of embodiment 13, 14, 15, 16, 17, 18, 19 or 20, wherein the ceramic carrier plate is approximately 0.38 mm in thickness.

Example embodiment 22: The optical transceiver package of embodiment 13, 14, 15, 16, 17, 18, 19, 20, or 21, wherein the electrically conductive thermal gap pad is approximately 0.6 millimeters in thickness.

Example embodiment 23: The optical transceiver package of embodiment 13, 14, 15, 16, 17, 18, 19, 20, 21, or 22, wherein the heat extraction path maintains an operating temperature on a top of the laser die that is within a 6-7° C. temperature delta with an operating temperature of the housing.

Example embodiment 24: A method of fabricating a semiconductor package, the method comprises mounting one of a ceramic carrier or a silicon interposer to a substrate, and mounting an integrated circuit (IC) die to the ceramic carrier or the silicon interposer. A heat extraction path is assembled away from the IC die, by: forming a thermal interface material over the IC die, the thermal interface material formed with a thickness of approximately 25 to 80 um; forming an integrated heat spreader over the thermal interface material; bonding a ceramic carrier plate on the integrated heat spreader; and forming an electrically conductive thermal pad between the ceramic carrier plate and a housing of the semiconductor package.

Example embodiment 25: The method of embodiment 24, further comprising mounting at least one of an integrated passive device or heat sink die between a top surface of the IC die and the thermal interface material.

What is claimed is:

1. A semiconductor package, comprising:
    a substrate;
    a ceramic carrier mounted to the substrate;
    an integrated circuit (IC) die mounted to the ceramic carrier; and a heat extraction path away from the IC die, the heat extraction path comprising:
a thermal interface material over the IC die, the thermal interface material having a thickness of approximately 25 to 80 um;
an integrated heat spreader over the thermal interface material;
a ceramic carrier plate over the integrated heat spreader; and
an electrically conductive thermal gap pad between the ceramic carrier plate and a housing of the semiconductor package.

2. The semiconductor package of claim 1, wherein the heat extraction path further comprises at least one of an integrated passive device (IPD) or a heat sink die (HSD).

3. The semiconductor package of claim 2, wherein the at least one of the IPD or the HSD is mounted to a top surface of the IC die via copper pillars.

4. The semiconductor package of claim 3, wherein the IPD is on a first portion of the IC die, and the HSD is over a second portion of the IC die.

5. The semiconductor package of claim 2, wherein the thermal interface material is over the at least one of the IPD or the HSD.

6. The semiconductor package of claim 5, wherein the thermal interface material (TIM) is over both the IPD or the HSD and a gap exist between a first portion of the TIM over the IPD and a second portion of the TIM over the HSD.

7. The semiconductor package of claim 1, wherein the integrated heat spreader comprises copper.

8. The semiconductor package of claim 7, wherein the integrated heat spreader is approximately 1.6 millimeters in thickness.

9. The semiconductor package of claim 1, wherein the ceramic carrier plate comprises aluminum nitride (AlN).

10. The semiconductor package of claim 9, wherein the ceramic carrier plate is approximately 0.38 mm in thickness.

11. The semiconductor package of claim 1, wherein the electrically conductive thermal gap pad is approximately 0.6 millimeters in thickness.

12. The semiconductor package of claim 1, wherein the heat extraction path maintains an operating temperature on a top of the IC die that is within a 6-7° C. temperature delta with an operating temperature of the housing.

13. An optical transceiver package, comprising:
a printed circuit board assembly (PCBA);
a ceramic carrier or a silicon interposer mounted to the PCBA;
a laser die mounted to the ceramic carrier or the silicon interposer; and
a heat extraction path away from the laser die, the heat extraction path comprising:
an integrated passive device (IPD) on a first portion of the laser die;
a heat sink die (HSD) over a second portion of the laser die;
a thermal interface material over both the IPD and the HSD;
a copper integrated heat spreader (IHS) over the thermal interface material;
a ceramic carrier plate over the copper integrated heat spreader; and
an electrically conductive thermal gap pad between the ceramic carrier plate and a housing of the optical transceiver package.

14. The optical transceiver package of claim 13, wherein the thermal interface material is approximately 25 to 80 um in thickness.

15. The optical transceiver package of claim 13 wherein the thermal interface material (TIM) is over both the IPD or the HSD, and a gap exist between a first portion of the TIM over the IPD and a second portion of the TIM over the HSD.

16. The optical transceiver package of claim 13, further comprising a laser driver die mounted adjacent to the laser die on the PCBA.

17. The optical transceiver package of claim 16, wherein the copper integrated heat spreader (IHS) extends over both the laser driver die and the laser die.

18. The optical transceiver package of claim 13, wherein the copper IHS includes at least one portion connected to PCBA ground.

19. The optical transceiver package of claim 13, wherein the copper IHS is approximately 1.6 millimeters in thickness.

20. The optical transceiver package of claim 13, wherein the ceramic carrier plate comprises aluminum nitride (AlN).

21. The optical transceiver package of claim 13, wherein the ceramic carrier plate is approximately 0.38 mm in thickness.

22. The optical transceiver package of claim 13, wherein the electrically conductive thermal gap pad is approximately 0.6 millimeters in thickness.

23. The optical transceiver package of claim 13, wherein the heat extraction path maintains an operating temperature on a top of the laser die that is within a 6-7° C. temperature delta with an operating temperature of the housing.

* * * * *